United States Patent
Jung et al.

(10) Patent No.: US 8,238,479 B2
(45) Date of Patent: Aug. 7, 2012

(54) SYNCHRONIZATION AND ACQUISITION FOR MOBILE TELEVISION RECEPTION

(75) Inventors: Gillyoung Jung, Pingree Grove, IL (US); Azzedine Touzni, Algonquin, IL (US); Xiaoqiang Ma, Streamwood, IL (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 708 days.

(21) Appl. No.: 12/403,502

(22) Filed: Mar. 13, 2009

(65) Prior Publication Data
US 2010/0232552 A1    Sep. 16, 2010

(51) Int. Cl.
H04L 27/00    (2006.01)
(52) U.S. Cl. ........ 375/324; 375/316; 375/322; 375/239; 329/311; 370/431
(58) Field of Classification Search .................. 375/324
See application file for complete search history.

(56) References Cited

U.S. PATENT DOCUMENTS

| | | | | |
|---|---|---|---|---|
| 5,463,351 | A * | 10/1995 | Marko et al. | 331/1 A |
| 5,822,373 | A * | 10/1998 | Addy | 375/259 |
| 7,098,821 | B2 * | 8/2006 | Husted et al. | 341/61 |
| 7,133,479 | B2 * | 11/2006 | Lee | 375/354 |
| 7,590,177 | B2 * | 9/2009 | Yu | 375/238 |
| 2001/0024474 | A1 * | 9/2001 | Rakib et al. | 375/259 |
| 2004/0120410 | A1 | 6/2004 | Priotti | |
| 2004/0190659 | A1 * | 9/2004 | Raj et al. | 375/350 |
| 2004/0208267 | A1 * | 10/2004 | Lee | 375/354 |
| 2005/0249276 | A1 * | 11/2005 | Yu | 375/238 |
| 2006/0008016 | A1 * | 1/2006 | Balakrishnan et al. | 375/260 |
| 2007/0133699 | A1 * | 6/2007 | Roh et al. | 375/260 |
| 2007/0171994 | A1 * | 7/2007 | Parker et al. | 375/260 |
| 2008/0101497 | A1 * | 5/2008 | Gaikwad et al. | 375/267 |
| 2008/0273481 | A1 * | 11/2008 | Chang | 370/311 |
| 2009/0060072 | A1 * | 3/2009 | Hamamoto | 375/260 |
| 2009/0161731 | A1 * | 6/2009 | Fudge | 375/137 |
| 2009/0209253 | A1 * | 8/2009 | Lewis | 455/434 |
| 2010/0079321 | A1 * | 4/2010 | Nentwig | 341/132 |
| 2010/0166092 | A1 * | 7/2010 | Tseng | 375/260 |
| 2011/0267546 | A1 * | 11/2011 | Kim et al. | 348/723 |

FOREIGN PATENT DOCUMENTS

| | | |
|---|---|---|
| GB | 2 408 182 | 5/2005 |
| WO | 00/33496 | 6/2000 |

OTHER PUBLICATIONS

"Narrow Band ISDB-T for Digital Terrestrial Sound Broadcasting", Specification of Channel Coding, Framing Structure and Modulation, (Nov. 29, 1999).

"Terrestrial Integrated Services Digital Broadcasting (ISDB-T)", Specification of Channel Coding, Framing Structure and Modulation, (Sep. 28, 1998).

Association of Radio Industries and Businesses, "Transmission System for Digital Terrestrial Television Broadcasting", ARIB Standard, ARIB STD-B31, Version 1.6, (Nov. 30, 2005).

\* cited by examiner

*Primary Examiner* — David Ometz
*Assistant Examiner* — Santiago Garcia
(74) *Attorney, Agent, or Firm* — Volpe and Koenig, P.C.

(57) ABSTRACT

A method for synchronizing a receiver to a received signal begins by down-converting the received signal to a first baseband signal. A coarse frequency offset (CFO) of the first baseband signal is determined and is applied to the down-converting of the received signal to a second baseband signal. A fine frequency offset (FFO) of the second baseband signal is determined. The receiver is synchronized to the received signal using the CFO and the FFO.

8 Claims, 2 Drawing Sheets

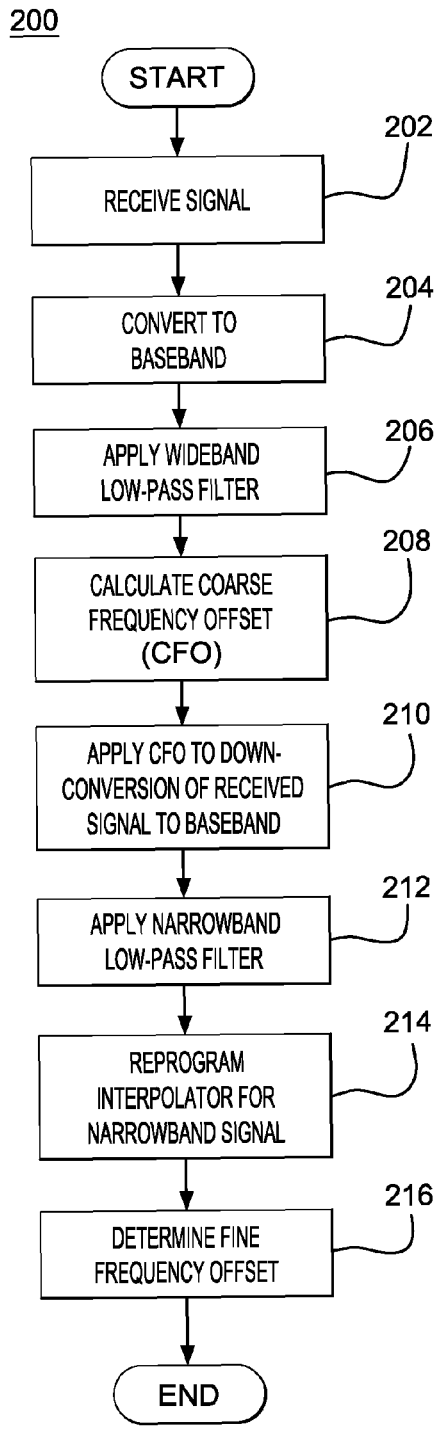
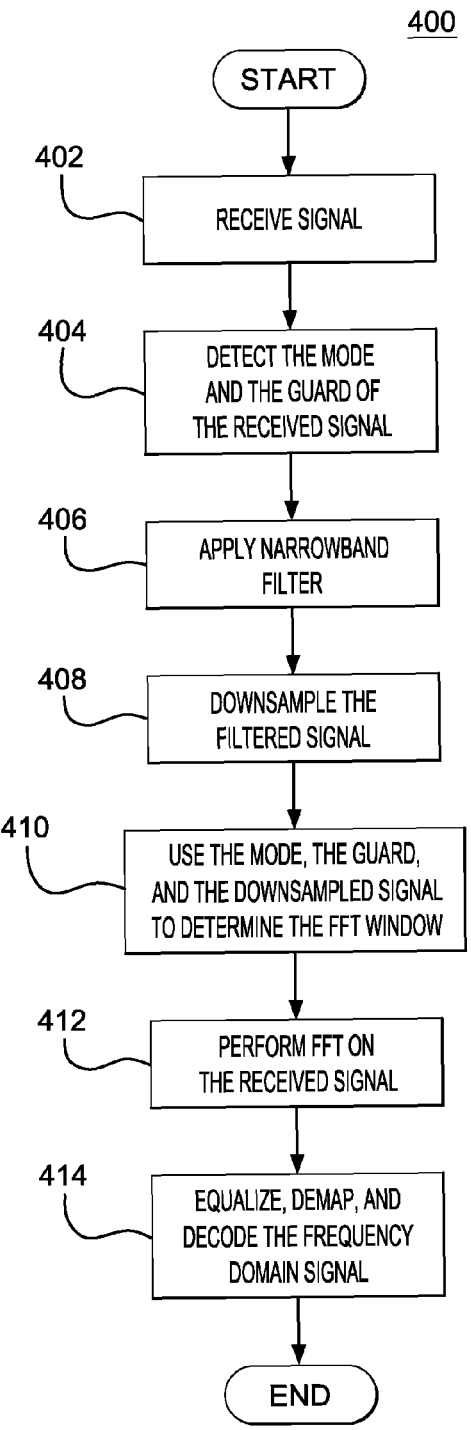
FIG. 2
FIG. 4

SYNCHRONIZATION AND ACQUISITION FOR MOBILE TELEVISION RECEPTION

FIELD OF INVENTION

The present invention relates generally to television reception, and more particularly, to synchronization and acquisition of a mobile television signal.

BACKGROUND

One goal in designing digital television receivers is to design a "universal" receiver—one that can receive as many different broadcast standards as possible. This goal may be possible because many television broadcast standards share common features. One design goal for a mobile television receiver is to implement a simple, low-cost design. For instance, this goal may be achieved by simplifying the tuner design and the signal extraction design, and reducing the power processing (to save as much power as possible).

For example, in the ISDB-T (Integrated Services Digital Broadcast-Terrestrial) standard, a broadcast signal includes 13 segments. There are three possible reception modes: all 13 segments, three segments, or one segment. There are multiple ways to construct a receiver, which can include a single tuner or multiple tuners. For example, a receiver may include only a one segment tuner or a 13 segment tuner, which would require adjustments on the transmitter side to accommodate the one tuner at the receiver. A multiple segment tuner (i.e., capable of receiving 13 segments, three segments, or one segment) may be used, but this type of tuner is more complex in operation and construction and is more expensive than other tuner types. A multiple segment tuner may not be as accurate for the one segment case as it is for the 13 segment case, for example. This results from a synchronization problem, especially for a coarse frequency offset (CFO). Synchronization is important to properly receive and display the broadcast signal.

CFO is used to estimate the frequency used. Determining the mode of the signal includes detecting the number of frequencies used per segment in the time domain. A "guard" is provided at the beginning of a transmission frame, to protect against signal leakage between consecutive symbols. In one implementation, the guard is a buffer that includes some repeated information.

The synchronization performance can be limited by the tuner. For example, in ISDB-T, some low-cost tuners exhibit envelope compression. For synchronization, the typical method uses a pilot signal. But this approach has a performance limitation if the receiver is not sufficiently accurate. Using a more accurate tuner can also result in a more complex tuner, in terms of operation and construction.

Generally, in an orthogonal frequency division multiplexing (OFDM) system (such as ISDB-T), the mode and the guard need to be determined prior to performing a fast Fourier transform (FFT) on the received signal. The signal includes a data portion and a cyclic prefix portion. To synchronize the system to obtain the data portion, the FFT window needs to be determined. By determining the mode and the guard of the signal, the FFT window can be determined. These two values identify how large the FFT window is and how large the prefix portion is. With an ISDB-T signal, if only one of the 13 segments of the signal is desired, then the number of prefix and data samples in one symbol may be very small, thereby making detecting the mode and the guard difficult.

SUMMARY

A wideband filter is applied to the received signal until the coarse frequency estimation is completed and the correction is applied to the signal. In one implementation, the tuner recited herein may be viewed as a 13 segment ISDB-T tuner that is modified for one segment reception. In standards such as ISDB-T, Media-Flo, etc., the non-desired bands of the received signal can be used to improve the synchronization function. When the synchronization is completed, the front-end filter switches to a narrowband filter to extract only the signal of interest.

Using all 13 segments of an ISDB-T signal permits the mode and the guard of the signal to be detected without using a filter. After detecting the mode and the guard, the unwanted segments of the ISDB-T signal can readily be filtered out.

BRIEF DESCRIPTION OF THE DRAWINGS

A more detailed understanding of the invention may be had from the following description, given by way of example, and to be understood in conjunction with the accompanying drawings, wherein:

FIG. 2 is a flowchart of a method for synchronizing a received signal;

FIG. 4 is a flowchart of a method for determining the mode and the guard of a received signal.

DETAILED DESCRIPTION

One method to determine the coarse frequency offset (CFO) is to detect an integer part of the frequency offset (which is recorded as the CFO). By using more of the pilot signal with a wideband low-pass filter, the CFO can more readily be detected. After detecting the CFO, the receiver switches to a narrowband low-pass filter to obtain the fine frequency offset (FFO). Using the full spectrum allows for a faster CFO determination. The mode and the guard of the received signal are also detected and used in tuning the receiver.

Synchronizing the Receiver

Figure 1:
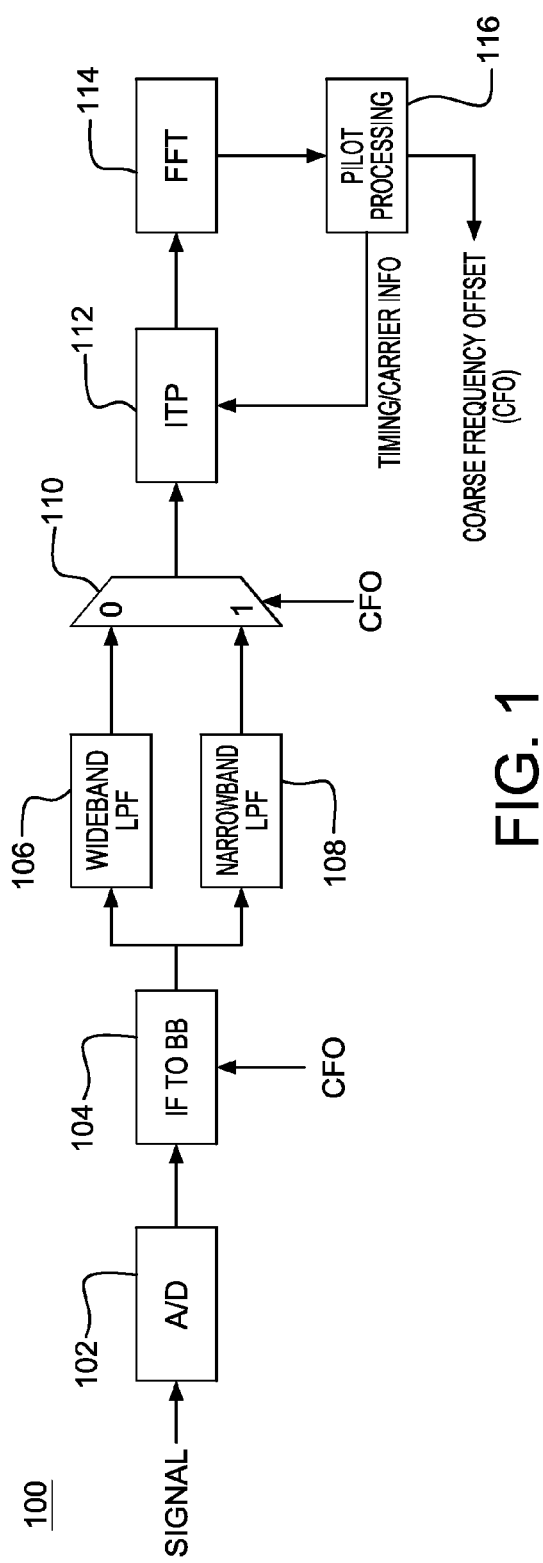
FIG. 1 is a block diagram of a receiver configured to perform synchronization of a received signal.

FIG. 1 is a block diagram of a receiver 100 configured to perform synchronization on a received signal. The receiver 100 includes an analog to digital (A/D) converter 102, an intermediate frequency (IF) to baseband (BB) down-converter 104, a wideband low-pass filter (LPF) 106, a narrowband LPF 108, a selector 110, an interpolator (ITP) 112, a fast Fourier transform (FFT) processor 114, and a pilot processor 116.

In operation, the received signal is converted to a digital signal by the A/D converter 102 and is down-converted to baseband by the IF to BB processor 104. The selector 110 first applies the wideband LPF 106 to the signal. The filtered signal is passed to the interpolator 112 and the FFT processor 114. After the FFT processor 114 converts the signal to the frequency domain, the pilot processor 116 determines the coarse frequency offset (CFO) and the timing and carrier information.

The CFO is provided to the IF to BB processor 104 to assist in down-converting the received signal. This simultaneously compensates for the frequency offset and a lack of a sharp narrowband filter introduced by using a low-cost tuner. Once the CFO calculation is determined, the CFO information is also determined. The CFO information is also provided to the selector 110, which switches from the wideband LPF 106 to the narrowband LPF 108. The timing and carrier information is passed to the interpolator 112, where it is used in estimating a fine frequency offset (FFO) for the received signal. The interpolator 112 is reprogrammed for the narrowband signal, because the information rate of the narrowband signal is different than the information rate of the wideband signal.

FIG. 2 is a flowchart of a method 200 for synchronizing to a received signal. A signal is received (step 202) and is down-converted to baseband (step 204). A wideband low-pass filter is applied to the baseband signal (step 206) and the CFO is calculated (step 208), by utilizing an interpolator, an FFT processor, and a pilot processor. The CFO is applied to the down-conversion process to adjust the processing of the received signal (step 210). A narrowband low-pass filter is applied to the baseband signal (step 212). The interpolator is reprogrammed for the narrowband signal (step 214), because the information rate of the narrowband signal is different than the information rate of the wideband signal. Then the fine frequency offset of the filtered signal is determined (step 216).

Reducing the filter band also reduces power consumption by resealing the sampling rate and the FFT size. The method 200 is general enough to be applied to a wide range of receivers and standards, and it is to be understood that the description of the method 200 in connection with the ISDB-T standard is used herein as an example.

Determining the Mode and the Guard

Figure 3:
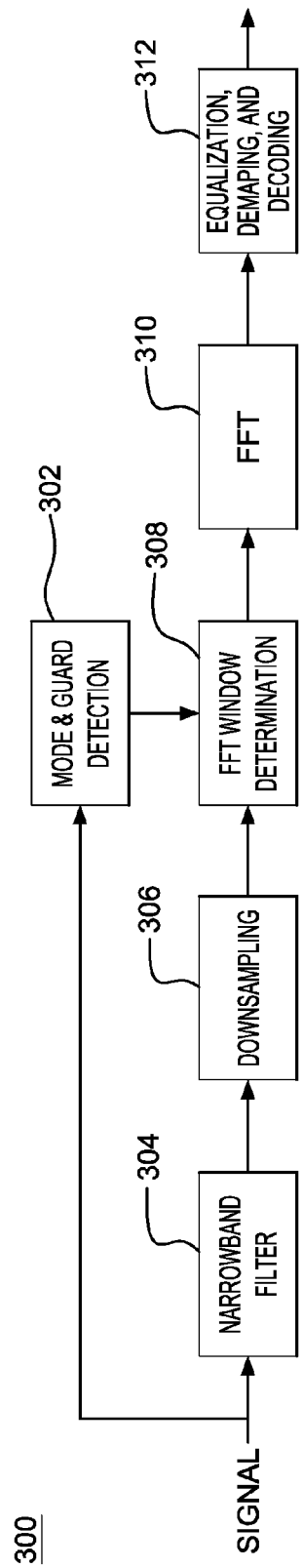
FIG. 3 is a block diagram of a receiver configured to determine the mode and the guard of a received signal.

FIG. 3 is a block diagram of a receiver 300 configured to determine the mode and the guard of a received signal. The receiver 300 includes a mode and guard detector 302, a narrowband filter 304, a downsampler 306, an FFT window determination device 308, an FFT device 310, and a decoding device 312.

In operation, the received wideband signal is passed to the mode and guard detector 302 and the narrowband filter 304. The mode and guard detection is performed without any downsampling of the received signal; i.e., all 13 data segments of the ISDB-T signal need to be present. After the mode and guard are detected, the received signal is passed through the narrowband filter 304 to retrieve the desired portion of the signal. The filtered signal is passed to the downsampler 306 where the signal is downsampled with the appropriate ratio. Then the FFT window determination device 308 uses the downsampled signal, the mode, and the guard to find the beginning of each symbol; i.e., the starting position where FFT needs to be applied. The beginning of each symbol is also referred to as the trigger, and is the fine timing offset of the symbol. The FFT device 310 converts the time domain signal to a frequency domain signal. The decoding device 312 equalizes, demaps, and decodes the frequency domain signal.

FIG. 4 is a flowchart of a method 400 for determining the mode and the guard of a received signal. A signal is received (step 402) and the mode and the guard for the entire (wideband) received signal is detected (step 304). For example, when receiving an ISDB-T signal, all 13 segments of the signal are used to determine the mode and the guard. After the mode and the guard have been detected, a narrowband filter is applied to the signal to extract the desired portions of the signal (step 406). The filtered signal is downsampled (step 408). The FFT window, which is the beginning of each symbol where FFT is to be applied, is determined using the detected mode and guard and the downsampled signal (step 410). The beginning of each symbol is also referred to as the trigger, and is the fine timing offset of the symbol. FFT is performed on the signal to obtain the frequency domain signal (step 412), which is then equalized, demapped, and decoded (step 414).

In one embodiment, determining the CFO and the mode and guard detection can be performed together as part of a single method to synchronize the receiver to a received signal.

The present invention can be implemented in a computer program tangibly embodied in a computer-readable storage medium containing a set of instructions for execution by a processor or a general purpose computer; and method steps can be performed by a processor executing a program of instructions by operating on input data and generating output data. Suitable processors include, by way of example, both general and special purpose processors. Typically, a processor will receive instructions and data from a read-only memory (ROM), a random access memory (RAM), and/or a storage device. Storage devices suitable for embodying computer program instructions and data include all forms of non-volatile memory, including by way of example semiconductor memory devices, magnetic media such as internal hard disks and removable disks, magneto-optical media, and optical media such as CD-ROM disks and digital versatile disks (DVDs). In addition, while the illustrative embodiments may be implemented in computer software, the functions within the illustrative embodiments may alternatively be embodied in part or in whole using hardware components such as Application Specific Integrated Circuits (ASICs), Field Programmable Gate Arrays (FPGAs), or other hardware, or in some combination of hardware components and software components.

While specific embodiments of the present invention have been shown and described, many modifications and variations could be made by one skilled in the art without departing from the scope of the invention. The above description serves to illustrate and not limit the particular invention in any way.

What is claimed is:

1. A receiver configured to synchronize to a received signal, comprising:
    an analog to digital converter, configured to convert the received signal to a digital signal;
    a baseband processor, configured to convert the digital signal to a baseband signal;
    a Fast Fourier Transform processor, configured to convert the baseband signal to a frequency domain signal; and
    a pilot processor, configured to determine a coarse frequency offset (CFO) and timing and carrier information from the frequency domain signal,
    wherein the baseband processor is further configured to receive the CFO and apply the CFO in converting the digital signal to the baseband signal;
    a wideband low-pass filter, configured to receive and filter the baseband signal;
    a narrowband low-pass filter, configured to receive and filter the baseband signal; and
    a selector in communication with the wideband low-pass filter and the narrowband low-pass filter, the selector configured to receive the CFO from the pilot processor, wherein upon receipt of the CFO, the selector is configured to select the narrowband low-pass filter.

2. The receiver according to claim 1, further comprising:
    an interpolator, configured to
        receive an output of the narrowband low-pass filter;
        receive the timing and carrier information from the pilot processor; and
        estimate a fine frequency offset of the received signal.

3. A method for synchronizing the receiver of claim 1 to said received signal, comprising the steps of:
    down-converting the received signal to a first baseband signal;
    determining a CFO of the first baseband signal;

applying the CFO to the down-converting of the received signal to a second baseband signal;

determining a fine frequency offset (FFO) of the second baseband signal; and synchronizing the receiver to the received signal using the CFO and the FFO.

4. The method according to claim 3, further comprising the step of:

applying said wideband low-pass filter to the first baseband signal.

5. The method according to claim 3, further comprising the step of:

applying said narrowband low-pass filter to the second baseband signal.

6. The method according to claim 5, wherein applying the narrowband low-pass filter reduces power consumption at the receiver by rescaling a sampling rate and reducing a Fast Fourier Transform window size.

7. The receiver according to claim 1, wherein said baseband processor, said Fast Fourier Transform processor, and said pilot processor form part of a single processor.

8. The receiver according to claim 1, further comprising:

said baseband processor, configured to convert the digital signal to a first baseband signal;

said pilot processor, configured to determine a coarse frequency offset (CFO) and timing and carrier information from the first baseband signal;

a mode and guard detector, configured to detect the mode and the guard of the received signal;

the baseband processor is further configured to receive the CFO and apply the CFO in converting the digital signal to a second baseband signal;

said narrowband filter, configured to filter the second baseband signal;

a downsampler, configured to downsample the filtered signal;

a Fast Fourier Transform (FFT) window determination device, configured to receive the downsampled signal and the mode and the guard; and determine an FFT window;

said FFT device configured to convert the downsampled signal to a frequency domain signal; and a decoding device, configured to decode the frequency domain signal.

* * * * *